(12) United States Patent
Chang et al.

(10) Patent No.: US 9,379,321 B1
(45) Date of Patent: Jun. 28, 2016

(54) CHALCOGENIDE GLASS COMPOSITION AND CHALCOGENIDE SWITCH DEVICES

(71) Applicant: Intel Corporation, Santa Clara, CA (US)

(72) Inventors: Kuo-Wei Chang, Cupertino, CA (US); Paolo Fantini, Vimercate (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/664,745

(22) Filed: Mar. 20, 2015

(51) Int. Cl.
| | |
|---|---|
| H01L 45/00 | (2006.01) |
| H01L 27/24 | (2006.01) |
| C03C 3/00 | (2006.01) |
| C03C 3/04 | (2006.01) |
| C03C 3/062 | (2006.01) |
| C03C 3/32 | (2006.01) |

(52) U.S. Cl.
CPC ............... *H01L 45/143* (2013.01); *C03C 3/00* (2013.01); *C03C 3/04* (2013.01); *C03C 3/062* (2013.01); *C03C 3/32* (2013.01); *C03C 3/321* (2013.01); *H01L 27/2409* (2013.01); *H01L 45/00* (2013.01); *H01L 45/04* (2013.01); *H01L 45/06* (2013.01); *H01L 45/14* (2013.01); *H01L 45/141* (2013.01)

(58) Field of Classification Search
CPC ......... H01L 45/00; H01L 45/04; H01L 45/06; H01L 45/14; H01L 45/141; H01L 45/143; C03C 3/00; C03C 3/04; C03C 3/062; C03C 3/32; C03C 3/321
See application file for complete search history.

(56) References Cited

U.S. PATENT DOCUMENTS

| | | | | |
|---|---|---|---|---|
| 5,389,584 A | * | 2/1995 | Aitken et al. | 501/40 |
| 2015/0318468 A1 | * | 11/2015 | Chan et al. | 257/E45.001 |

OTHER PUBLICATIONS

Ovshinsky, S.R., "Reversible Electrical Switching Phenomena in Disordered Structures," Physical Review Letters, vol. 21, No. 20, Nov. 11, 1968, pp. 1450-1456.
Bustin, O., et al., "Slow Structural Relaxations of Glass-Forming Maltitol by Modulated DSC Calorimetry," The Journal of Chemical Physics (AIP), vol. 110, No. 22, Jun. 8, 1999, pp. 10982-10992, doi: 10.1063/1.478041.

* cited by examiner

*Primary Examiner* — Eduardo A Rodela
(74) *Attorney, Agent, or Firm* — Schwabe, Williamson & Wyatt, P.C.

(57) ABSTRACT

Embodiments of the present disclosure describe chalcogenide glass compositions and chalcogenide switch devices (CSD.) The compositions generally may include 3% to 15%, silicon, 8% to 16% germanium in, greater than 45% selenium, and 20% to 35% arsenic, by weight. The amount of silicon and germanium in a composition generally may include more than 10% by weight. CSDs may include various compositions of chalcogenide glass, and a plurality of them may be used in a memory device, such as die with a memory component, and may be used in various electronic components and systems. Other embodiments may be described and/or claimed.

25 Claims, 5 Drawing Sheets

CHALCOGENIDE GLASS COMPOSITION AND CHALCOGENIDE SWITCH DEVICES

FIELD

Embodiments of the present disclosure generally relate to the field of integrated circuits, and more particularly, to chalcogenide glass compositions for threshold switches.

BACKGROUND

Chalcogenide glass compositions are used in chalcogenide switch devices, including semiconductor memory devices. These compositions generally have a threshold voltage at which they become conductive, i.e., they switch on to allow current flow through a switch. The threshold voltage can change over time. This change is referred to as drift. High drift of compositions can limit the usefulness and performance of devices using chalcogenide switches.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe chalcogenide glass compositions and chalcogenide switch devices (CSD.) In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, state machine, and/or other suitable components that provide the described functionality.

A chalcogenide glass composition with low voltage drift and useful for chalcogenide-based switches may include the elements Silicon (Si), Germanium (Ge), Selenium (Se), and Arsenic (As). Chalogenide glass compositions may be comprised of the compositions identified in TABLE 1, which provides composition ranges by weight percentage of Si, Ge, Se, and As, as well as a specific composition identified as the third composition.

TABLE 1

|  | Si | Ge | Se | As |
| --- | --- | --- | --- | --- |
| First (%) | 3-15 | 8-16 | >45 | 20-35 |
| Second (%) | 8-12 | 9-12 | >50 | 29-31 |
| Third (%) | 10 | 10 | 50 | 30 |

The chalcogenide glass compositions of TABLE 1 may have the silicon plus the germanium equal to 10% or greater by weight, relative to the total weight of a particular composition. The chalcogenide glass compositions of TABLE 1 may have the silicon plus the germanium equal to 15% or greater by weight, relative to the total weight of a particular composition. The chalcogenide glass compositions of TABLE 1 may have the silicon plus the germanium equal to 20% or greater by weight, relative to the total weight of a particular composition. The chalcogenide glass compositions of TABLE 1 may have the glass transition temperature equal to or greater than 300 degrees Celsius, depending on the semiconductor process used to manufacture a device with a chalcogenide switch device (CSD.) The glass transition temperature of a composition may be lowered as the temperature of a semiconductor process is lowered below 300 degrees Celsius.

Figure 1:
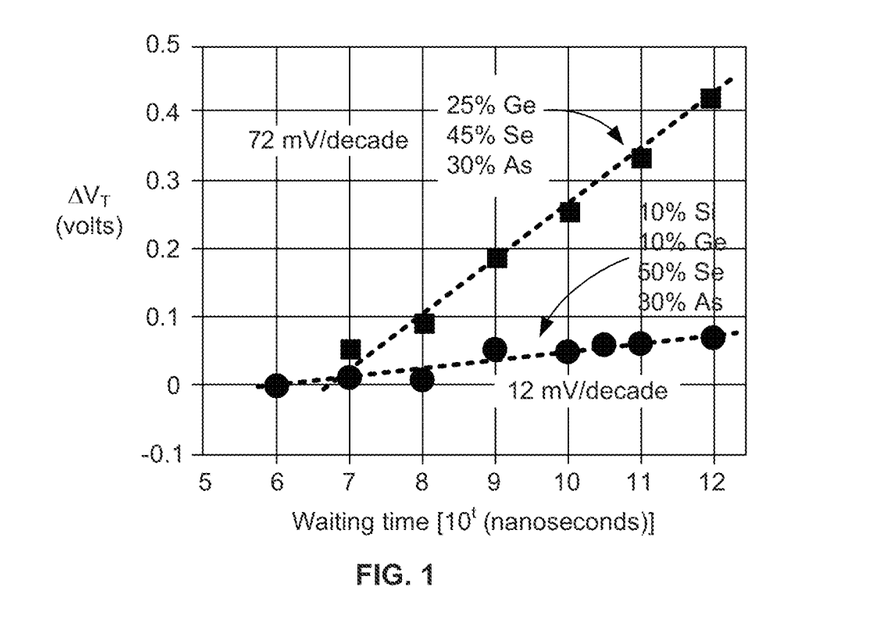
FIG. 1 is a plot of a comparison of a chalcogenide glass composition of the present disclosure to another chalcogenide glass composition, illustrating lower voltage drift of the composition of the present disclosure, in accordance with some embodiments.

FIG. 1 is a plot of a comparison of a chalcogenide glass composition of the present disclosure to another chalcogenide glass composition, illustrating lower voltage drift of the composition of the present disclosure, in accordance with some embodiments. The chalcogenide glass composition of the present disclosure shown in FIG. 1 is the third composition shown in Table 1. The third composition may have a voltage drift of about 12 millivolts per decade of time in nanoseconds (mv/decade nsec) in a semi-log plot of change in threshold voltage versus log base 10 of waiting time in nanoseconds, as illustrated in FIG. 1. For clarity, a decade is $1\times10^1$, and two decades is $1\times10^2$. For clarity, after one decade ($10^1\times1$ nanosecond), the change in drift voltage would be 0.12 my. After two decades ($10^2\times1$ nanosecond), the change would be 0.24 millivolts. A voltage drift of 12 my/decade nsec may be about 5-6 times lower than the prior art chalcogenide composition of 72 my/decade nsec. A lower voltage drift may provide a better performing CSD since there is less total voltage drift over a period of time. Glass transition temperature and glass processing conditions have an impact upon a composition selection within the ranges provided in Table 1.

Figure 2:
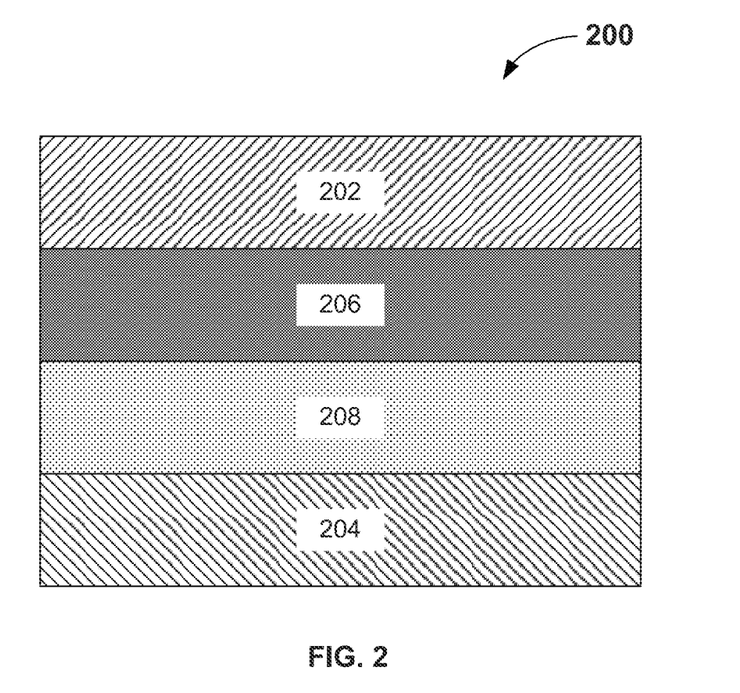
FIG. 2 schematically illustrates a cross-section side view of an example threshold switch device, in accordance with some embodiments.

FIG. 2 schematically illustrates a cross-section side view of an example threshold switch device 200, in accordance with some embodiments. Device 200 may have a first electrode 202 and a second electrode 204. Coupled between the first electrode 202 and the second electrode 204 may be a chalcogenide switch element 208 and a semiconductor element 206. The chalcogenide switch element 208 may comprise a composition as illustrated in Table 1. The electronic element 206 may be a semiconductor memory element including a non-volatile memory element or a volatile memory element. The electronic element 206 may be a semiconductor phase change memory element. The element 206 may be in a first state. The element may be changed to a second state by application of a voltage greater than the threshold voltage of the chalcogenide switch element 208 to the second electrode for a period of time. The semiconductor element may be changed to a third or fourth state by application of a voltage greater than the threshold voltage of the chalcogenide switch element 208 to the second electrode for a different period of time. Threshold switch device 200 may be in a memory device with a plurality of threshold switch devices 200 as an array in two dimensions or in three dimensions. First electrode 202 may be a bit line while second electrode may be a word line, of a memory device. Second electrode 204 may be a bit line while first electrode may be a word line, of a memory device. Various dielectric layers may be formed between bit lines, word lines, the chalcogenide switch element 208, and the electronic element 206, as generally known in the art of semiconductor memory design.

Figure 3:
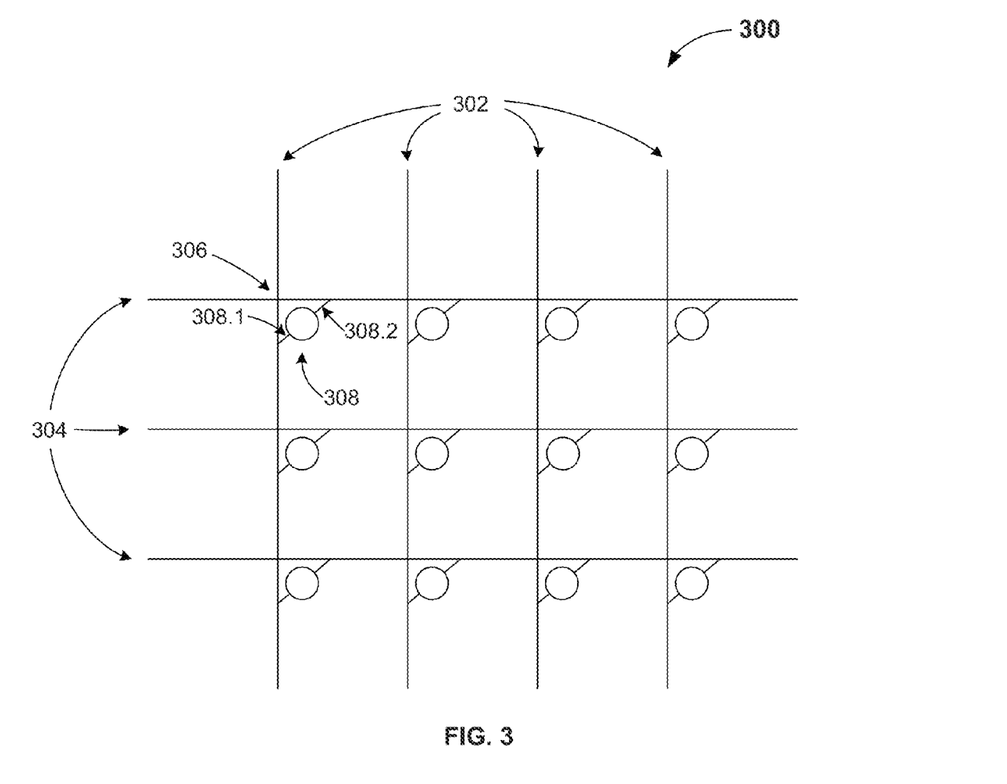
FIG. 3 schematically illustrates a top view of an example memory device, in accordance with some embodiments.

FIG. 3 schematically illustrates a top view of an example memory device 300, in accordance with some embodiments. Memory device 300 may have a plurality of bit lines 302 and a plurality of word lines 304. At the intersection 306 of the bit lines and the word lines, a memory element 308 may be coupled to a bit line 302 and a word line 304. The memory element 308 may be coupled by conductive pathways 308.1, 308.2, such as a bridge, or directly coupled to a bit line and a word line. The memory element 308 may include a semiconductor memory element 206 FIG. 2 and chalcogenide switch element 208 of FIG. 2, and may include the chalcogenide glass compositions of Table 1.

Figure 4:
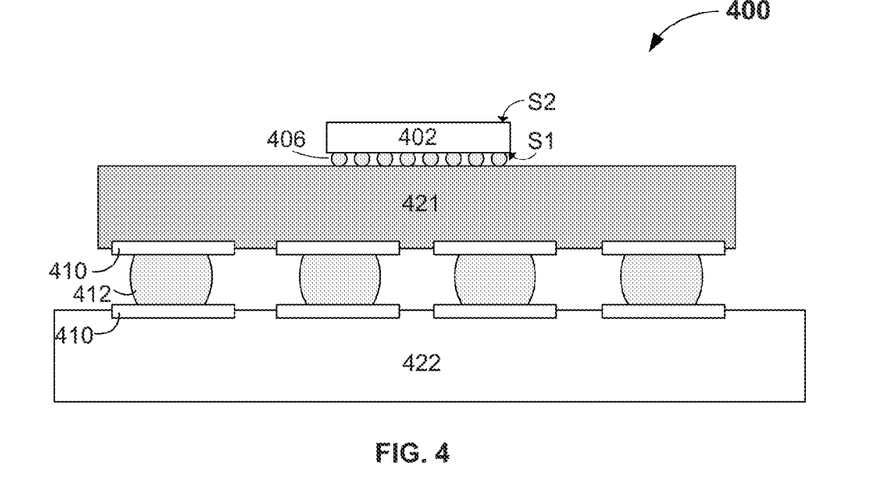
FIG. 4 schematically illustrates a cross-section side view of an integrated circuit (IC) assembly, in accordance with some embodiments.

FIG. 4 schematically illustrates a cross-section side view of an integrated circuit (IC) assembly 400, in accordance with some embodiments. In some embodiments, the IC assembly 400 may include one or more dies (hereinafter "die 402") electrically and/or physically coupled with a package substrate 421. The die 402 may include circuitry (e.g., circuitry of a memory device 300 of FIG. 3) such as a CSD or memory device with a CSD, as described herein. In some embodiments, the package substrate 421 may be coupled with a circuit board 422, as can be seen.

The die 402 may represent a discrete product made from a semiconductor material (e.g., silicon) using semiconductor fabrication techniques such as thin film deposition, lithography, etching and the like used in connection with forming CSDs. In some embodiments, the die 402 may be, include, or be a part of a processor, memory, system-on-chip (SoC) or ASIC in some embodiments. In some embodiments, an electrically insulative material such as, for example, molding compound or underfill material (not shown) may encapsulate at least a portion of the die 402 and/or die-level interconnect structures 406.

The die 402 can be attached to the package substrate 421 according to a wide variety of suitable configurations including, for example, being directly coupled with the package substrate 421 in a flip-chip configuration, as depicted. In the flip-chip configuration, an active side, S1, of the die 402 including active circuitry is attached to a surface of the package substrate 421 using die-level interconnect structures 406 such as bumps, pillars, or other suitable structures that may also electrically couple the die 402 with the package substrate 421. The active side S1 of the die 402 may include circuitry such as, for example, CSD circuitry. An inactive side, S2, may be disposed opposite to the active side S1, as can be seen. In other embodiments, the die 402 may be disposed on another die that is coupled with the package substrate 421 in any of a variety of suitable stacked die configurations. For example, a processor die may be coupled with the package substrate 421 in a flip-chip configuration and the die 402 may be mounted on the processor die in a flip-chip configuration and electrically coupled with the package substrate using through-silicon vias (TSVs) formed through the processor die. In still other embodiments, the die 402 may be embedded in the package substrate 421 or coupled with a die that is embedded in the package substrate 421. Other dies may be coupled with the package substrate 421 in a side-by-side configuration with the die 402 in other embodiments.

In some embodiments, the die-level interconnect structures 406 may be configured to route electrical signals between the die 402 and the package substrate 421. The electrical signals may include, for example, input/output (I/O) signals and/or power/ground signals that are used in connection with operation of the die. The die-level interconnect structures 406 may be coupled with corresponding die contacts disposed on the active side S1 of the die 402 and corresponding package contacts disposed on the package substrate 421. The die contacts and/or package contacts may include, for example, pads, vias, trenches, traces and/or other suitable contact structures.

In some embodiments, the package substrate 421 may be an epoxy-based laminate substrate having a core and/or build-up layers such as, for example, an Ajinomoto Build-up Film (ABF) substrate. The package substrate 421 may include other suitable types of substrates in other embodiments including, for example, substrates formed from glass, ceramic, or semiconductor materials.

The package substrate 421 may include electrical routing features configured to route electrical signals to or from the die 402. The electrical routing features may include, for example, package contacts (e.g., pads 410) disposed on one or more surfaces of the package substrate 421 and/or internal routing features (not shown) such as, for example, trenches, vias or other interconnect structures to route electrical signals through the package substrate 421.

The circuit board 422 may be a printed circuit board (PCB) composed of an electrically insulative material such as an epoxy laminate. For example, the circuit board 422 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, vias may be formed through the electrically insulating layers to route the electrical signals of the die 402 through the circuit board 422. The circuit board 422 may be composed of other suitable materials in other embodiments. In some embodiments, the circuit board 422 is a motherboard (e.g., motherboard 502 of FIG. 5).

Package-level interconnects such as, for example, solder balls 412 may be coupled to pads 410 on the package substrate 421 and/or on the circuit board 422 to form corresponding solder joints that are configured to further route the electrical signals between the package substrate 421 and the circuit board 422. The pads 410 may be composed of any suitable electrically conductive material such as metal including, for example, nickel (Ni), palladium (Pd), gold (Au), silver (Ag), copper (Cu), and combinations thereof. The package-level interconnect may include other structures and/or configurations including, for example, land-grid array (LGA) structures and the like.

The IC assembly 400 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 402 and other components of the IC assembly 400 may be used in some embodiments.

Figure 5:
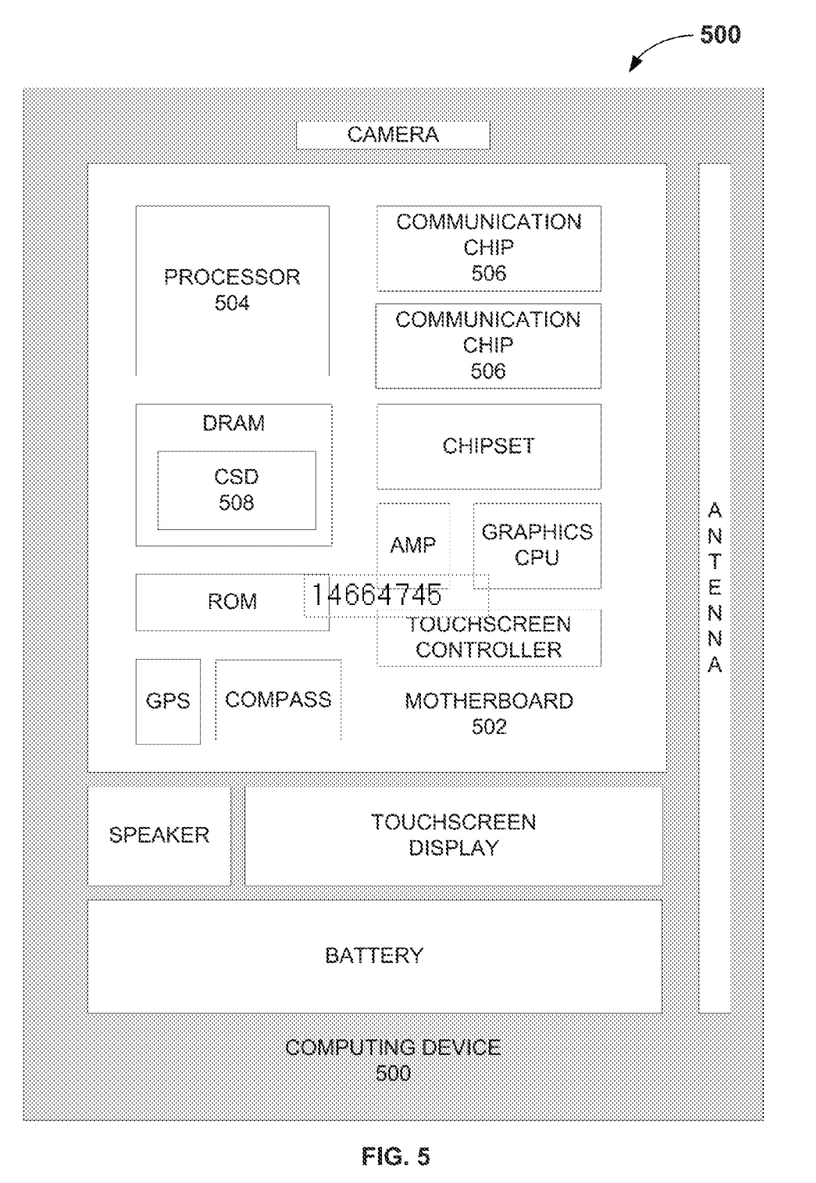
FIG. 5 schematically illustrates an example system that includes a chalcogenide glass composition in a switch device in accordance with various embodiments described herein.

Embodiments of the present disclosure may be implemented into a system using any suitable hardware and/or software to configure as desired. FIG. 5 schematically illustrates an example system (e.g., a computing device 500) that includes a memory device with a CSD in accordance with various embodiments described herein. The computing device 500 may house a board such as motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

According to various embodiments, the CSD 508 may comport with embodiments described herein. For example, the CSD 508 may include a CSD as described in FIGS. 2 and 3, as further described herein.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other embodiments.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, EV-DO, and others.

In various implementations, the computing device 500 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

EXAMPLES

According to various embodiments, the present disclosure describes a chalcogenide glass composition, chalcogenide switch devices such as chalcogenides switch memory devices, and systems with chalcogenide switch devices.

Example 1 of a chalcogenide composition may include silicon in the range from 3% to 15% by weight, relative to a total weight of the composition; germanium in the range from 8% to 16% by weight, relative to the total weight of the composition; selenium in an amount greater than 40% by weight, relative to the total weight of the composition; and arsenic in the range from 20% to 35% by weight, relative to the total weight of the composition. Example 2 may include Example 1 and other examples herein, wherein the silicon may be in the range from 8% to 12% by weight, relative to the total weight of the composition. Example 3 may include Examples 1-2 and other examples herein, wherein the germanium may be in the range from 9% to 12% by weight, relative to the total weight of the composition. Example 4 may include Examples 1-3 and other examples herein, wherein the selenium may be in an amount greater than 50% by weight, relative to the total weight of the composition. Example 5 may include Examples 1-4 and other examples herein, wherein the arsenic may be in the range from 29% to 31% by weight, relative to the total weight of the composition. Example 6 may include Examples 1-5 and other examples herein, wherein the silicon plus the germanium may be 20% or greater by weight, relative to the total weight of the composition. Example 7 may include Examples 1-6 and other examples herein, wherein the glass transition temperature may be greater than 300 degrees Celsius. Example 8 may include Examples 1-7 and other examples herein, wherein the composition may have a drift of about 12 millivolts per decade of waiting time in nanoseconds.

Example 9 of a chalcogenide composition may include silicon in the range from 8% to 12% by weight, relative to a total weight of the composition; germanium in the range from 9% to 12% by weight, relative to the total weight of the composition; selenium in an amount greater than 49% by weight, relative to the total weight of the composition; and arsenic in the range from 29% to 31% by weight, relative to the total weight of the composition. Example 10 may include Example 9 and other examples herein, wherein the silicon plus the germanium may be 20% or greater by weight, relative to the total weight of the composition. Example 11 may include Examples 9-10 and other examples herein, wherein the composition may have a drift of about 12 millivolts per decade of waiting time in nanoseconds. Example 12 may include Examples 9-11 and other examples herein, wherein the glass transition temperature may be greater than 300 degrees Celsius.

Example 13 of an apparatus may include a first electrode; a second electrode; and a selector switch coupled between the first and second electrodes, wherein the selector switch may include a chalcogenide glass with a composition that may include silicon in the range from 3% to 15% by weight, relative to a total weight of the composition; germanium in the range from 8% to 16% by weight, relative to the total weight of the composition; selenium in an amount greater than 45% by weight, relative to the total weight of the composition; and arsenic in the range from 20% to 35% by weight, relative to the total weight of the composition. Example 14 may include Example 13 and other examples herein, wherein the silicon plus the germanium may be 20% or greater by weight, relative to the total weight of the composition. Example 15 may include Examples 13-14 and other examples herein, wherein the composition may have a drift of about 12 millivolts per decade of waiting time in nanoseconds. Example 16 may include Examples 13-15 and other examples herein, wherein the glass transition temperature may be greater than 300 degrees Celsius.

Example 17 of a memory device may include a bit line electrode; a word line electrode, the word line electrode may be across the bit line electrode at a cross point; a memory cell, coupled between the bit line electrode and the word line electrode at the cross point, wherein the memory cell comprises a memory element and a selector switch coupled to the memory element, wherein the selector switch may include a chalcogenide glass with a composition comprising: silicon in the range from 3% to 15% by weight, relative to a total weight of the composition; germanium in the range from 8% to 16% by weight, relative to the total weight of the composition; selenium in an amount greater than 45% by weight, relative to the total weight of the composition; and arsenic in the range from 20% to 35% by weight, relative to the total weight of the composition. Example 18 may include Example 17 and other examples herein, wherein the silicon plus the germanium may be 20% or greater by weight, relative to the total weight of the composition. Example 19 may include Examples 17-18 and other examples herein, wherein the composition may have a drift of about 12 millivolts per decade of waiting time in nanoseconds. Example 20 may include Examples 17-19 and other examples herein, wherein the glass transition temperature may be greater than 300 degrees Celsius.

Example 21 of a system may include a circuit board; a die coupled to the circuit board, the die may include: a memory device that may include: a bit line electrode; a word line electrode, the word line electrode may be across the bit line electrode at a cross point; a memory cell, coupled between the bit line electrode and the word line electrode at the cross point, wherein the memory cell comprises a memory element and a selector switch coupled to the memory element, wherein the selector switch may include a chalcogenide glass with a composition comprising: silicon in the range from 3% to 15% by weight, relative to a total weight of the composition; germanium in the range from 8% to 16% by weight, relative to the total weight of the composition; selenium in an amount greater than 45% by weight, relative to the total weight of the composition; and arsenic in the range from 20% to 35% by weight, relative to the total weight of the composition. Example 22 may include Example 21 and other examples herein, wherein the silicon plus the germanium may be 20% or greater by weight, relative to the total weight of the composition. Example 23 may include Examples 21-22 and other examples herein, wherein the composition may have a drift of about 12 millivolts per decade of waiting time in nanoseconds. Example 24 may include Examples 21-23 and other examples herein, wherein the glass transition temperature may be greater than 300 degrees Celsius. Example 25 may include Examples 17-24 and other examples herein, wherein the system may be a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments. The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize. These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:
1. A chalcogenide glass composition, comprising:
silicon in a range from 3% to 15% by weight, relative to a total weight of the composition;
germanium in a range from 8% to 16% by weight, relative to the total weight of the composition;
selenium in an amount greater than 40% by weight, relative to the total weight of the composition; and arsenic in a range from 20% to 35% by weight, relative to the total weight of the composition.

2. The chalcogenide glass composition of claim 1, wherein the silicon is in the range from 8% to 12% by weight, relative to the total weight of the composition.

3. The chalcogenide glass composition of claim 1, wherein the germanium is in the range from 9% to 12% by weight, relative to the total weight of the composition.

4. The chalcogenide glass composition of claim 1, wherein the selenium is in an amount greater than 50% by weight, relative to the total weight of the composition.

5. The chalcogenide glass composition of claim 1, wherein the arsenic is in the range from 29% to 31% by weight, relative to the total weight of the composition.

6. The chalcogenide glass composition of claim 1, wherein the silicon plus the germanium is 20% or greater by weight, relative to the total weight of the composition.

7. The chalcogenide glass composition of claim 1, wherein a glass transition temperature is greater than 300 degrees Celsius.

8. The chalcogenide glass composition of claim 1, wherein the composition has a drift of about 12 millivolts per decade of waiting time in nanoseconds.

9. A chalcogenide glass composition, comprising:
silicon in a range from 8% to 12% by weight, relative to a total weight of the composition;
germanium in a range from 9% to 12% by weight, relative to the total weight of the composition;
selenium in an amount greater than 49% by weight, relative to the total weight of the composition; and
arsenic in a range from 29% to 31% by weight, relative to the total weight of the composition.

10. The chalcogenide glass composition of claim 9, wherein the silicon plus the germanium is 20% or greater by weight, relative to the total weight of the composition.

11. The chalcogenide glass composition of claim 9, wherein the composition has a drift of about 12 millivolts per decade of waiting time in nanoseconds.

12. The chalcogenide glass composition of claim 9, wherein a glass transition temperature is greater than 300 degrees Celsius.

13. A apparatus comprising:
a first electrode;
a second electrode; and
a selector switch coupled between the first and second electrodes, wherein the selector switch includes a chalcogenide glass with a composition comprising:
silicon in a range from 3% to 15% by weight, relative to a total weight of the composition;
germanium in a range from 8% to 16% by weight, relative to the total weight of the composition;
selenium in an amount greater than 45% by weight, relative to the total weight of the composition; and
arsenic in a range from 20% to 35% by weight, relative to the total weight of the composition.

14. The apparatus of claim 13, wherein the silicon plus the germanium is 20% or greater by weight, relative to the total weight of the composition.

15. The apparatus of claim 13, wherein the composition has a drift of about 12 millivolts per decade of waiting time in nanoseconds.

16. The apparatus of claim 13, wherein a glass transition temperature is greater than 300 degrees Celsius.

17. A memory device comprising:
a bit line electrode;
a word line electrode, the word line electrode is across the bit line electrode at a cross point;
a memory cell, coupled between the bit line electrode and the word line electrode at the cross point, wherein the memory cell comprises a memory element and a selector switch coupled to the memory element, wherein the selector switch includes a chalcogenide glass with a composition comprising:
silicon in a range from 3% to 15% by weight, relative to a total weight of the composition;
germanium in a range from 8% to 16% by weight, relative to the total weight of the composition;
selenium in an amount greater than 45% by weight, relative to the total weight of the composition; and
arsenic in a range from 20% to 35% by weight, relative to the total weight of the composition.

18. The memory device of claim 17, wherein the silicon plus the germanium is 20% or greater by weight, relative to the total weight of the composition.

19. The memory device of claim 17, wherein the composition has a drift of about 12 millivolts per decade of waiting time in nanoseconds.

20. The memory device of claim 17, wherein a glass transition temperature is greater than 300 degrees Celsius.

21. A system, comprising:
a circuit board;
a die coupled to the circuit board, the die comprising:
a memory device comprising:
a bit line electrode;
a word line electrode, the word line electrode is across the bit line electrode at a cross point;
a memory cell, coupled between the bit line electrode and the word line electrode at the cross point, wherein the memory cell comprises a memory element and a selector switch coupled to the memory element, wherein the selector switch includes a chalcogenide glass with a composition comprising:
silicon in a range from 3% to 15% by weight, relative to a total weight of the composition;
germanium in a range from 8% to 16% by weight, relative to the total weight of the composition;
selenium in an amount greater than 45% by weight, relative to the total weight of the composition; and
arsenic in a range from 20% to 35% by weight, relative to the total weight of the composition.

22. The system of claim 21, wherein the silicon plus the germanium is 20% or greater by weight, relative to the total weight of the composition.

23. The system of claim 21, wherein the composition has a drift of about 12 millivolts per decade of waiting time in nanoseconds.

24. The system of claim 21, wherein a glass transition temperature is greater than 300 degrees Celsius.

25. The system of claim 21, wherein the system is a mobile computing device including one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board.

* * * * *